(12) United States Patent
Callahan et al.

(10) Patent No.: US 8,858,708 B1
(45) Date of Patent: Oct. 14, 2014

(54) POLYCRYSTALLINE III-NITRIDES

(75) Inventors: Michael J. Callahan, Hanson, MA (US); Buguo Wang, Burlington, MA (US); John S. Bailey, Temple, NH (US)

(73) Assignee: The United States of America As represented by the Secretary of the Air Force, Washington, DC (US)

( * ) Notice: Subject to any disclaimer, the term of this patent is extended or adjusted under 35 U.S.C. 154(b) by 1127 days.

(21) Appl. No.: 12/817,548

(22) Filed: Jun. 17, 2010

Related U.S. Application Data

(63) Continuation-in-part of application No. 11/326,684, filed on Dec. 30, 2005, now abandoned.

(60) Provisional application No. 60/640,964, filed on Jan. 3, 2005.

(51) Int. Cl.
*C30B 25/00* (2006.01)

(52) U.S. Cl.
USPC .................. 117/99; 117/84; 117/88; 117/91; 117/105; 117/952

(58) Field of Classification Search
USPC .......... 117/84, 88, 91, 99, 105, 952; 9/84, 88, 9/91, 99, 105, 952
See application file for complete search history.

(56) References Cited

U.S. PATENT DOCUMENTS

| | | | |
|---|---|---|---|
| 4,690,841 A | 9/1987 | Tanji et al. | |
| 6,113,985 A * | 9/2000 | Suscavage et al. | 427/255.39 |
| 6,177,057 B1 | 1/2001 | Purdy | |
| 6,398,867 B1 | 6/2002 | D'Evelyn et al. | |
| 6,406,540 B1 * | 6/2002 | Harris et al. | 117/104 |
| 6,592,663 B1 | 7/2003 | Sarayama et al. | |
| 6,656,285 B1 | 12/2003 | Melink et al. | |
| 6,676,752 B1 | 1/2004 | Suscavage et al. | |
| 6,861,130 B2 | 3/2005 | D'Evelyn et al. | |
| 6,969,426 B1 | 11/2005 | Bliss et al. | |
| 2004/0003495 A1 * | 1/2004 | Xu | 29/832 |
| 2005/0104082 A1 | 5/2005 | Oshima | |

OTHER PUBLICATIONS

Balkas et al, "Synthesis Routes and Characterization of High purity, single phase Gallium nitride powders," Journal of the Ameircan Ceramic Society, vol. 79, No. 9, p. 2309-2312 (1996).*
Balkas et al., "Synthesis Routes and Characterization of High-Purity, Single-Phase Gallium Nitride Powders," J Am. Ceram. Soc. vol. 79 No. 90 (Sep. 1996) pp. 9-12.

(Continued)

*Primary Examiner* — Matthew Song
(74) *Attorney, Agent, or Firm* — AFMCLO/JAZ; Jeffrey R. Moore

(57) ABSTRACT

This invention provides a process for producing high-purity dense polycrystalline III-nitride slabs. A vessel which contains a group III-metal such as gallium or an alloy of group III-metals of shallow depth is placed in a reactor. The group III-metal or alloy is heated until a molten state is reached after which a halide-containing source mixed with a carrier gas and a nitrogen-containing source is flowed through the reactor vessel. An initial porous crust of III-nitride forms on the surface of the molten III-metal or alloy which reacts with the nitrogen-containing source and the halide-containing source. The flow rate of the nitrogen-containing source is then increased and flowed into contact with the molten metal to produce a dense polycrystalline III-nitride. The products produced from the inventive process can be used as source material for III-nitride single crystal growth which material is not available naturally.

24 Claims, 4 Drawing Sheets

III-nitride Production System

(56) References Cited

OTHER PUBLICATIONS

Wang et al., "Synthesis of dense polycrystalline GaN of high purity by the chemical vapor reaction process," Journal of Crystal Growth 286 (2006) pp. 50-54.

Edjer, "Growth and Morphology of GaN," Journal of Crystal Growth 22 (1974) 44-46.

Argoitie et al., "Low pressure synthesis of bulk, polycrystalline gallium nitride," Appl. Phys. Lett. 70, 179 (1997); doi: 10.1063/1.118350.

Marusha et al., "The Preparation and Properties of Vapordeposited Singlecrystalline GaN," Appl. Phys. Lett. 15, 327 (1969); doi: 10.1063/1.1652845.

* cited by examiner

III-nitride Production System

Close-up view of NH$_4$Cl & Ga boats at start of III-Nitride run

Close-up view of Ga boat at start of III-Nitride run

Close-up view of Ga boats at end of III-Nitride run

View of solid source halide of Fig. 3 replaced with gaseous HC1

Polycrystalline GaN slab of the invention

POLYCRYSTALLINE III-NITRIDES

CROSS-REFERENCE TO RELATED APPLICATIONS

This application is a Continuation-in-Part of U.S. application Ser. No. 11/326,684 filed Dec. 30, 2005, now abandoned. U.S. application Ser. No. 11/326,684 claims the benefit of U.S. Provisional Application No. 60/640,964, filed Jan. 3, 2005.

STATEMENT OF GOVERNMENT INTEREST

The invention described herein may be manufactured and used by or for the Government for governmental purposes without the payment of any royalty thereon.

FIELD OF THE INVENTION

This invention relates to the preparation of metal nitrides, particularly the preparation of polycrystalline metal nitrides.

BACKGROUND OF THE INVENTION

Gallium nitride was first grown by H. P. Maruska and J. J. Tietjen, *Appl. Phys. Lett.*, 15, 327 (1969) using hydride vapor phase epitaxy (HVPE). It employs gaseous hydrogen chloride to flow over and pick up metallic gallium and produce gallium chloride. The gallium chloride is then reacted with ammonia to form single crystal gallium nitride on a substrate. Today, this is the preferred method for growing single crystal gallium nitride, the native substrate for the growth of the metal nitrides.

There has been a concerted effort by several groups to produce single crystal GaN by many methods including the aforementioned HVPE method, ammonothermal growth, U.S. Pat. Nos. 6,656,615, 6,398,867, and 6,177,057, and flux growth, U.S. Pat. No. 6,592,663, and single crystal AlN has been produced by sublimation growth. There have also been several methods to produce GaN and AlN powder such as E. Ejder, et al., *J. of Cryst. Growth*, 22, 44 (1974).

Despite the large number of processes developed for gallium nitride and aluminum nitride single crystals and powders, there have been relatively few efforts in producing dense polycrystalline GaN. There has been some concentrated effort on producing polycrystalline AlN for heat sinks because of the high thermal conductivity of AlN. However, state of the art AlN heat sinks have high levels of impurities, especially oxygen, due to the difficulty in sintering AlN into high-density forms from high-purity AlN powder because of low self-diffusion rates in strongly covalently-bonded nitrides such as AlN and GaN. Therefore, oxygen-containing or other impurity-containing compounds are added to aid in sintering, and temperatures greater than 1800° C. are employed to achieve bodies of nearly full density.

It is known in the art that oxygen reduces thermal conductivity in the nitrides that are desirable for heat sinks. Furthermore, InN and GaN start decomposing at high temperatures, which prevents them from being sintered without the addition of substantial nitrogen overpressures. The processes described above to produce single crystal nitride substrates (excluding HVPE, which uses Ga metal) would also benefit from an inexpensive source of high-purity, low-cost, high-density polycrystalline GaN. Furthermore, by doping polycrystalline group III nitrides such as InN, GaN, AlN and the corresponding alloys with rare earth metals and transition metals such as chromium and titanium, ceramic solid state laser hosts can be constructed that would have improved performance over current ceramic laser hosts. Finally, thin deposition techniques such as laser ablation and sputtering would benefit high-purity, dense, commercial nitride sputtering targets which are not currently available.

D'Evelyn et al. in U.S. Pat. No. 6,861,130 employed hot pressing of GaN powder to obtain polycrystalline GaN with commercial GaN powder. It is now known in the art that the majority of commercial powder has a high level of oxygen impurities, which most likely aid in the densifying of the polycrystalline GaN. Use of this process with high purity GaN powder would produce lower density polycrystalline GaN and the high pressures used limits the practicability of this method for commercial uses.

U.S. Pat. Nos. 6,406,540 and 6,113,985 describe a method using ammonium halides to produce several forms of GaN, including polycrystalline, but the polycrystalline material was in the form of a thin crust that formed on the gallium metal or on a substrate that appeared to be much less than 1.0 mm in thickness (see FIG. 6). Argoita, et al., *Appl. Phys. Lett.*, 70, 179 (1997) also formed a thin layer of polycrystalline GaN with a nitrogen plasma. The difficulty of using the above techniques to produce a polycrystalline slab of GaN in which a nitrogen-containing gas is flowed over molten Ga is that a nearly 100% dense GaN crust forms on the surface of the molten Ga, which then blocks further contact of the gas with the Ga metal and ends the process with a relatively low yield.

Several groups have used the sublimation process to grow high purity polycrystalline AlN, but sublimation is conducted at very high temperatures and extremely expensive crucibles are required, which have a shelf life of only several hundred hours. Therefore, no inexpensive, reliable method for producing high-purity polycrystalline III-nitride, including GaN, in bulk or slab form has been reported. There is accordingly a need and market for a new method that avoids these shortcomings to produce high-density, high-purity, large-area, bulk polycrystalline III-nitrides.

SUMMARY OF THE INVENTION

Broadly, the present invention provides a method for making polycrystalline III-nitride of high purity and density comprising flowing a halide-containing vapor and a nitrogen-containing vapor into contact with a molten group III-metal by: (a) flowing the two vapors over the molten metal to form a porous crust in a first flow; and (b) increasing the flow rates of the nitrogen vapor relative to the halide vapor flow in a second flow, to contact the remaining molten III-metal through the pores and convert substantially all of the remaining molten metal to III-nitride in the form of a dense slab.

The present invention further provides the above method wherein the molten group III-metal is molten gallium and the crust forms thereover of sufficient pores, which are formed due to the relatively slow pace and brief duration of the first flow. The pores are then kept open by the second flow to allow the molten gallium, below the crust, to wick up through the pores so that the molten gallium contacts the increased flow of the nitrogen vapor for a suitable period to convert 90% or more of the molten gallium to GaN in the form of a dense slab.

The invention further provides a method for making a III-nitride comprising the reaction:

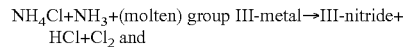

more specifically also provides;
a method for making GaN comprising the reaction:

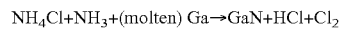

The invention further provides a method for making polycrystalline III-nitride formed by flowing separately the gases of HCl and $NH_3$ into contact with a molten group III-metal to form polycrystalline III-nitride.

The reaction can be given by:

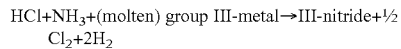

HCl+$NH_3$+(molten) group III-metal→III-nitride+½ $Cl_2$+$2H_2$

The invention further provides a polycrystalline III-nitride comprising a mass or slab of high purity and from 75 to 99% dense.

DEFINITIONS

By "ammonia" or "$NH_3$", as used herein, is meant ammonia gas or vapor unless otherwise specified.

By "shallow depth", as used herein, is meant a depth of less than 10 cm to less than 1.0 cm, including 9.99 to 0.01 cm in a pilot operation but which may be scaled up considerably.

By "porous crust or layer", as used herein, is meant that which permits flow of gas or liquid therethrough.

By "minimal flow of vapor or gas", as used herein, is meant a flow sufficient to react with the group III-metal.

By "GaN particle size", as used herein, is meant that which may range from nanometers (nm) to microns (μm) to millimeter (mm) scale or more, depending upon process conditions.

By "yield of dense III-nitride", as used herein, is meant a density of 40-99.9 mole % yield in the boat as a slab of III-nitride/group III-metal.

By "slab of dense III-nitride", as used herein, is meant a three-dimensional form of polycrystalline III-nitride, formed by one two-step pass, which may have a thickness of, e.g., 0.1 to 0.5 mm.

By "block of dense III-nitride", as used herein, is meant a three-dimensional form of polycrystalline III-nitride formed by a plurality of such two-step passes, which may have a thickness comprising multiples of the slab thickness, e.g. 0.2 to 1.0 to 5.0 mm or more.

BRIEF DESCRIPTION OF THE DRAWINGS

The invention will become more apparent from the following detailed specification and drawings in which.

DESCRIPTION OF PREFERRED EMBODIMENTS

Figure 1:
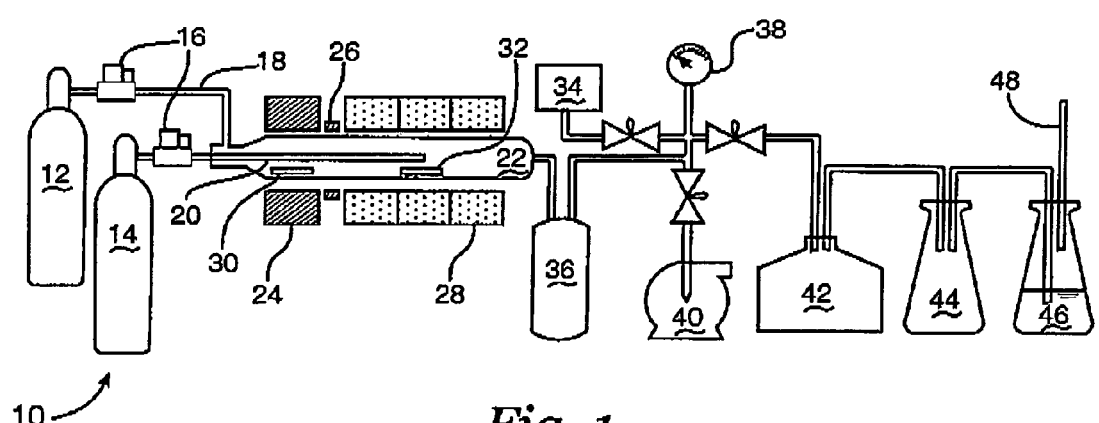
FIG. 1 is an elevation schematic view of an apparatus for performing a method according to the present invention.

The presently disclosed invention provides methods for producing polycrystalline III-nitride materials, where the group III metal may be Ga, Al, In, and B and other variations listed below, as well as the resulting III-nitride products. Referring now to the drawings, like reference numerals may designate like or corresponding parts throughout the several views.

The following tables label the components shown in FIG. 1 by number.

| 12 | Nitrogen Tank |
|---|---|
| 14 | Ammonia Tank |
| 16 | Mass Flow Controllers |
| 18 | Nitrogen Inlet |
| 20 | Ammonia Feed Tube |
| 22 | Quartz Reaction Tube |
| 24 | Heater Jacket |
| 26 | Heating Tape |
| 28 | Three Zone Furnace |
| 30 | Ammonium Chloride Boat |
| 32 | Gallium Boat |
| 34 | Pressure Transducer |
| 36 | Stainless Steel Collector Tank |
| 38 | Vacuum Gauge |
| 40 | Pump |
| 42 | Oil Trap |
| 44 | Empty Beaker |
| 46 | Beaker Filled With Water |
| 48 | Exhaust Tube |

Figure 2:
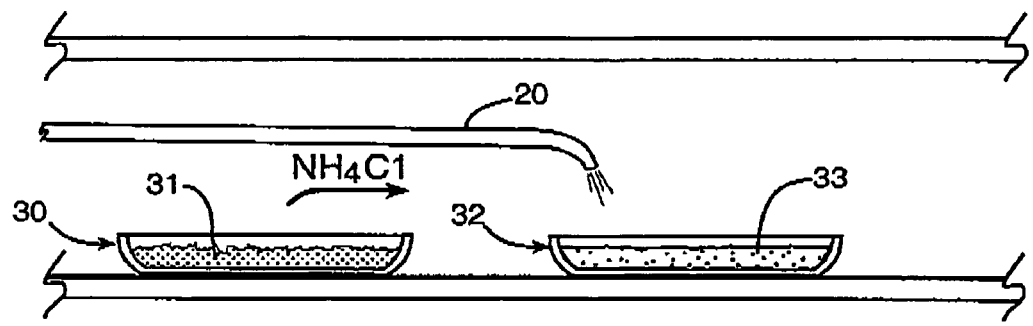
FIGS. 2-4 are fragmentary elevation schematic views of components of the apparatus shown in FIG. 1.
Figure 3:
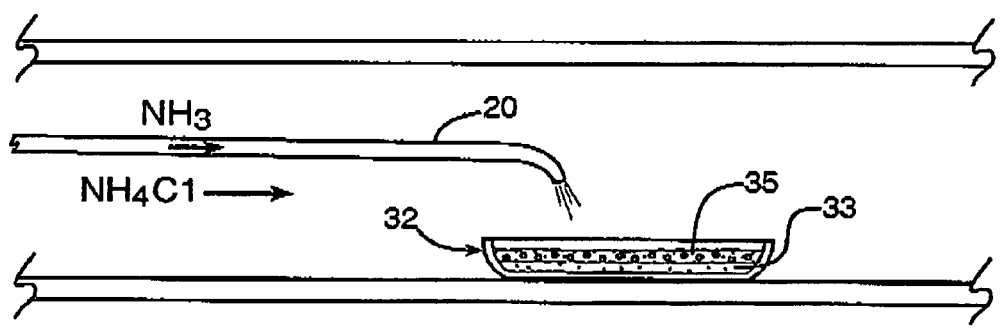

Thus, as shown in FIG. 1, a III-nitride production system 10 is illustrated, e.g., for the production of GaN. Referring to FIGS. 1-3, an ammonium chloride source 31 ($NH_4Cl$-5-9s purity in powder form) in an ammonium chloride boat 30 sublimes upon sufficient heating by a heating jacket 24 and heating tape 26 and is flowed by carrier gas from nitrogen tank 12, which enters via the nitrogen inlet 18 and carries the ammonium chloride vapor downstream. Meanwhile, the reaction chamber, which includes a three-zone furnace 28, a quartz reaction tube 22, and a reactant recovery system 42, 44, 46, and 48, is prepared. The three-zone furnace 28 is activated to heat the gallium to a molten state. Then, the $NH_4Cl$ vapor is conveyed by the carrier gas into the reaction chamber and over the molten gallium 33 where a porous crust 35 is formed of GaN until it covers or nearly covers the molten gallium in the gallium boat 32, as shown or indicated in FIGS. 1-3, where porous crust 35 sits atop molten gallium 33.

Figure 4:
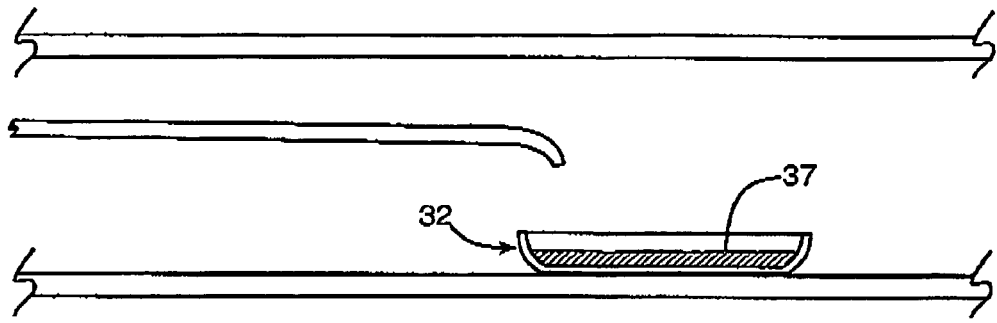

Following formation of the porous crust 35, the ammonia tank 14 is opened, and $NH_3$ is flowed down the ammonia feed tube 20 to join the $NH_4Cl$ vapor. The flow of the two vapors is controlled by mass flow controllers 16. As both vapors flow over and into the porous crust 35 and through the pores of the porous crust 35 to contact the molten gallium 33 below or to meet the molten gallium 33 that has wicked up into the pores, the vapors convert the molten gallium 33 to GaN and progressively densify the porous crust 35 and the molten gallium 33 from 75 to 95 to 99% dense or more. Thus is formed a highly dense polycrystalline GaN slab 37, which largely replaces the porous crust 35 above and the majority of the molten gallium 33 below, as shown in FIG. 4.

That is, FIGS. 1-4 show a two-step process in which $NH_4Cl$ vapor (and/or its byproducts or constituents) contacts and reacts with the molten gallium 33 to form an initial porous crust 35 atop the molten gallium 33 per FIG. 3 as the first step, and then as the second step, the continuing $NH_4Cl$ flow is joined by an $NH_3$ flow that arrives in a separate ammonia feed tube 20. The two flows pass over and into the porous crust 35 and react with the remaining molten gallium 33 to densify the porous crust 35 and molten gallium 33 into a high density GaN slab 37 per FIG. 4.

The gallium boat 32 is preferably elongated and relatively wide and shallow to permit thorough contact of ammonia vapor or other reactive nitrogen-containing vapor such as activated nitrogen plasma with molten gallium 33 through the porous crust 35.

The excess byproducts of the above GaN conversion are captured in the recovery system downstream, such as in vessels 36, 42, 44, 46, and 48, which include a separation chamber to capture excess $NH_4Cl$ and other precipitants and a chamber containing water for scrubbing HCl, $Cl_2$ and $NH_3$, before arriving at exhaust tube 48 as shown or indicated in FIG. 1. The recovery system further includes a pressure transducer 34, vacuum gauge 38, and pump 40 that may be used to control entry of the byproducts into the recovery system. The nitrogen-containing source and halide-containing source may also originate from the same feed or tube in some embodiments but would be impracticable in the embodiment depicted in FIG. 1 because solid ammonium chloride would form unless the whole length of the ammonia feed tube 20 is heated to over 350° C.

Figure 5:
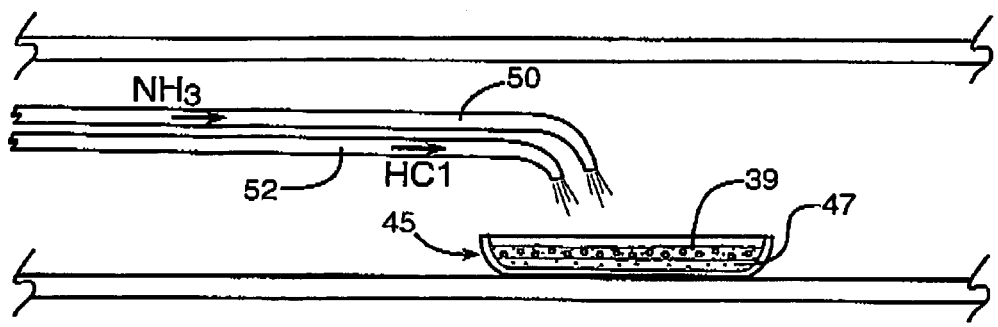
FIG. 5 is an elevation schematic view of a variation of components shown in FIG. 1 in another embodiment of the present invention.

In an alternative embodiment of the inventive method shown in FIG. 5, the solid halide, e.g., $NH_4Cl$, may be replaced with a gaseous halide, such as HCl, which flows in a separate feed to work in conjunction with $NH_3$ that also flows in a separate feed tube. That is, HCl flows, via the halide feed tube 52 and $NH_3$ flows, via the nitrogen feed tube 50, and the two flows pass at or near equivalent flow rates over and into a gallium boat 45 containing molten Ga 47. The equivalent or nearly equivalent flows of HCl and $NH_3$ vapors react with the surface of the molten Ga 47 to form a porous crust 39 thereover, as described above with respect to FIG. 3, and additional $NH_3$ flow is added, via the nitrogen feed tube 50, to join the continuing flow of the HCl. The two flows pass over and into the porous crust 39 and react with the remaining molten Ga 47 thereunder to progressively densify the porous crust 39 and the molten Ga 47 into a high density polycrystalline GaN slab from 75 to 95 to 99% dense or more, such as high density GaN slab 37 indicated in FIG. 4.

The flow rates of the halide-containing source, the nitrogen-containing source, and the carrier gases may be adjusted to vary both the flow rates and flow velocities of the gases or vapors that react with the molten III-metals. The length, diameter, and shape of the reactor vessel or any of the feed tubes of the vapors or gases, shown in the FIGS. herein, may be varied, and the distance of the exhaust or end of any feed tubes to the molten metal may also be varied, to further adjust the flow rates, flow velocities, and reaction kinetics of the gases and vapors with the molten III-metal. Variation of the flow rates, flow velocities, and surface kinetics may be employed to form porous III-metal layers of varying levels of porosity, thus enabling an initial high porosity crust using one set of conditions and further densification using a second set of conditions as indicated in Examples 3 and 4 herein.

As previously described, U.S. Pat. No. 6,406,540 and U.S. Pat. No. 6,113,985 disclose a method using ammonium halides to produce several forms of GaN including polycrystalline. However, such material is in the form of single crystal needles sandwiched between two thin polycrystalline GaN crusts, such as the material shown in FIG. 6, to provide a relatively fragile structure 53 of thin crusts containing a low density and crumbling interior.

Figure 7:
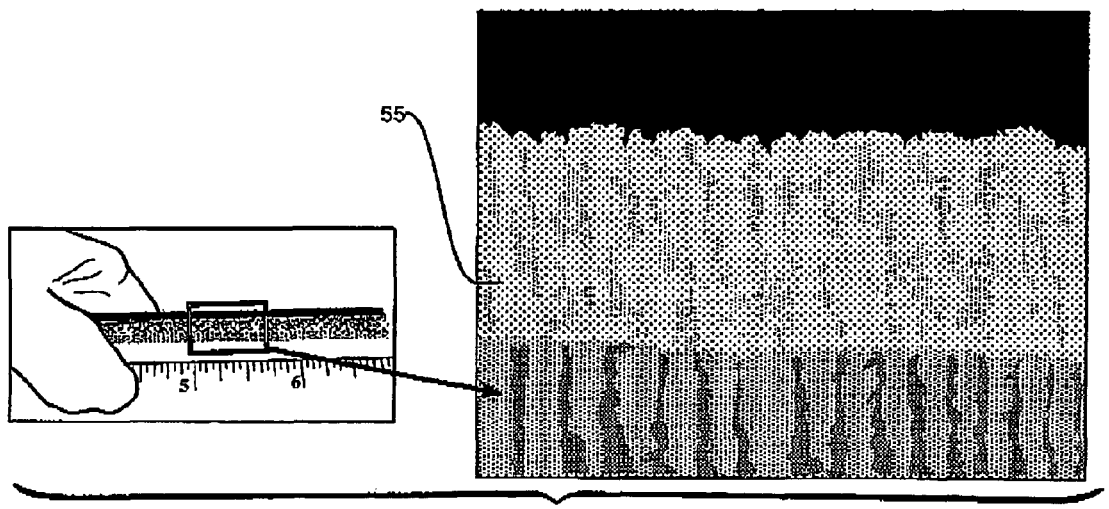
FIG. 7 is a perspective view of a high density GaN slab formed by a method embodying the present invention.

In contrast, the presently disclosed invention provides a high density, high purity polycrystalline III-nitride slab 55, as shown in FIG. 7, which is highly useful as source material for III-nitride substrates grown by the previously described methods and future inventive methods of single crystal III-nitride production that require a source of polycrystalline III-nitride material. For instance, it is known in the art that it is extremely difficult to grow high quality single crystals of quartz hydrothermal with silica powder, thus natural polycrystalline quartz is employed. Ammonothermal growth of GaN referenced previously is the analog of quartz growth and therefore will need a source of inexpensive, dense, high purity polycrystalline III-nitride nutrient that is not available naturally. Other applications for the material invented herein may include high thermal conductivity heat sinks, targets for thin film III-nitride growth, polycrystalline substrates for solar cells, and ceramic solid state laser hosts. The material invented herein may also be processed into a fine powder to be used in phosphor, display, source material for ceramic laser hosts and other applications.

The following examples are provided to illustrate the invention and should not be construed in limitation thereof.

Example 1

In a prior art chemical vapor reaction process (CVRP) process, 20 grams of ammonium chloride was placed in a quartz boat, 20 grams of gallium was placed in a quartz boat, and 20 grams of gallium was placed in a quartz basket inside the apparatus shown in FIG. 1. The basket was 2 cm in diameter×3 cm in height, and the level of the gallium was 2 cm. After the components were loaded and the reactor was assembled, a 5% hydrogen/nitrogen mixture was flowed at 225 sccm at room temperature into the quartz reaction tube (1.2 m×7 cm). While the reactor was being purged with forming gas, the temperature was increased, heating the gallium to the reaction temperature of 900° C. in 4 hours. The carrier gas was flowed for an additional 14 hours, after which ammonium chloride vapor was introduced into the reaction zone by heating the ammonium chloride solid source to 225° C. with an external heating jacket while still maintaining the carrier gas flow at 225 sccm. The ammonium chloride continued to flow over the gallium for 24 hours, whereupon a spherical mass was formed around the rim of the quartz basket. The mass consisted of a mushroom-shaped polycrystalline GaN crust on top with many mm size single crystal, c-plane GaN platelets with thicknesses in the range of 0.1 mm underneath and significant amounts of unreacted Ga metal at the bottom of the basket.

Example 2

Figure 6:
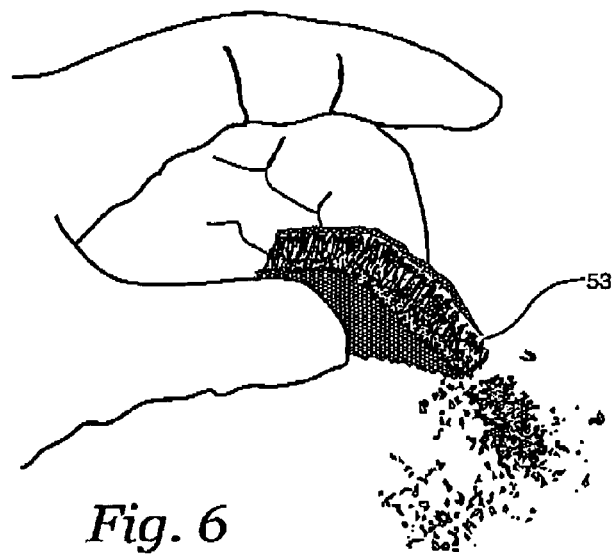
FIG. 6 is a perspective view of polycrystalline GaN as prepared according to methods taught by the prior art.

In a prior art CVRP process, 60 grams of ammonium chloride and 40 grams of gallium were placed in the their respective quartz boats inside the apparatus shown in FIG. 1. The gallium boat was 18 cm long×3 cm wide×2 cm in height, and the level of the gallium was 1.5 cm. After the components were loaded and the reactor was assembled, a 5% hydrogen/nitrogen mixture was flowed at 225 sccm at room temperature into the quartz reaction tube (1.2 m×7 cm). While the reactor was being purged with forming gas, the temperature was increased, heating the gallium to the reaction temperature of 900° C. in 4 hours. The carrier gas was flowed for an additional 14 hours, after which ammonium chloride vapor was introduced into the reaction zone by heating the ammonium chloride solid source to 225° C. with an external heating jacket while still maintaining the carrier gas flow at 225 sccm. The ammonium chloride continued to flow over the gallium for 24 hours, whereupon a spherical mass was formed. The mass consisted of many mm size single crystal, c-plane GaN platelets with thicknesses in the range of 0.1 mm sandwiched between top and bottom polycrystalline GaN crusts as shown in FIG. 6.

Example 3

The Present Invention with $NH_4Cl$ and a Quartz Boat Containing a Shallow Level of Ga 35 grams (0.65 mol) of ammonium chloride and 42 grams of gallium (0.60 mol) were placed in their respective quartz boats. The gallium boat was 18 cm long×3 cm wide×2 cm in height, and the level of the gallium was 0.6 cm. After the components were loaded and the reactor was assembled, a high purity (99.999%) forming gas was flowed at 225 sccm at room temperature into the quartz reaction tube (1.2 m×7 cm dia.). While the system was being purged with the forming gas, the temperature was increased, heating the gallium boat to the reaction temperature of 1000° C. in 4 hours. The carrier gas continued to be flowed and the gallium heated overnight to remove oxides from the surface of the gallium and to rid the system of oxygen. After sufficient purging, ammonium chloride vapor was then introduced into the reaction zone by heating the $NH_4Cl$ source to 225° C. with an external heating jacket. The ammonium chloride and the carrier gas were flowed over the gallium to form an initial porous crust of GaN on top of the molten gallium, as shown in FIG. 3. After 15 minutes, 75 sccm of ammonia flow was initiated directly over the gallium surface, in addition to the ammonium chloride vapor and carrier gas. The ammonia flow was isolated from the ammonium chloride and carrier gas stream by means of a separate quartz tube attached to a flow regulator, which is attached to a high purity ammonia tank. The ammonium chloride, carrier gas and ammonia were flowed over the gallium melt for 6 hours during which the porous GaN layer thickened. At the conclusion of the run, a gallium nitride hard gray slab formed in the gallium boat (2 mm thick×3.0 cm×8.0 cm with a weight of 25 grams) as indicated in FIG. 4, and a 0.5 hard yellow layer of GaN with a weight of 7 grams formed on the walls of the quartz reaction tube. The yield of gallium nitride slab to the gallium metal source was 46%. The resulting polycrystalline GaN slab had a density of ~96% and is shown in FIG. 7. Oxygen impurity levels were measured at 160 ppm, and total metallic impurities were measured at less than <50 ppm by glow discharge mass spectrometry analysis.

Example 4

The Present Invention with a Quartz Boat Containing a Shallow Level of Ga that is Reacted with HCl and $NH_3$ 30 grams of gallium is placed in a quartz boat that is 18 cm long×3 cm wide×2 cm high, and the level of the gallium is 0.4 cm. The reactor is then assembled, and a high purity (99.999%) forming gas is flowed at 225 sccm at room temperature into the quartz reaction tube (1.2 m×7 cm dia.). While the system is being purged with the forming gas, the temperature is increased; heating the gallium boat to the reaction temperature of 1000° C. in 4 hours. The carrier gas continues to be flowed while the gallium is heated overnight to remove oxides from the surface of the gallium and to rid the system of oxygen. After sufficient purging, hydrogen chloride and ammonia are introduced directly over the molten gallium with equal flow rates of 20 sccm in order to form an initial porous crust of GaN on top of the molten gallium, as shown in FIG. 5. The ammonia and hydrogen chloride are isolated from the initial forming gas stream by means of separate quartz tubes, and two additional forming gas sources are flowed in the hydrogen chloride flow stream and ammonia flow stream at 100 sscm to aid in the transport of the hydrogen chloride and ammonia to the gallium. After 15 minutes, the ammonia flow is increased to 100 sccm for 6 hours, which allows the porous GaN layer to thicken. At the conclusion of the run, a GaN hard slab is formed in the gallium boat.

DISCUSSION

The present invention thus provides a process and apparatus for producing high purity, dense polycrystalline III-nitride materials wherein III=gallium (GaN), aluminum (AlN), indium (InN), boron, and binary and ternary nitrides such as gallium aluminum nitride or gallium aluminum indium nitride. In one embodiment of the presently disclosed methods, a vessel that contains a group III-metal or an alloy of group III-metals of shallow depth is placed in a reactor. The group III-metal or alloy is heated until a molten state is reached, after which a halide-containing vapor mixed with a carrier gas and a nitrogen-containing source or vapor is flowed through the reactor vessel. The halide source or vapor may originate from a solid halide compound, e.g., in chunk or powder form, which sublimes when heated and mixes with the carrier gas. Alternatively, a high purity, regulated stream of gaseous halide compound may be mixed with the carrier gas to produce the gaseous halide source stream. The nitrogen vapor may be ammonia or another non-inert or reactive gaseous nitrogen-containing source, including plasma gases. In some embodiments, the nitrogen source may be combined with the halide as a single source containing both nitrogen and halide.

An initial porous layer of III-nitride forms on the surface of the molten III-metal or alloy, which is formed by reaction with the nitrogen-containing source and the halide-containing source. The flow rate of the nitrogen-containing source or an additional nitrogen-containing source is then adjusted to produce a dense polycrystalline III-nitride by the continued reaction of the gaseous nitrogen source or sources, III-metal or alloy, and the halide source. The product is polycrystalline III-nitride of nearly stoichmetric ratios, with densities of 75% or greater and less than 500 parts per million (ppm) total impurities. In some embodiments, the resulting polycrystalline III-nitride has a density greater than 95%, i.e., in a range of 95-99% or more, with impurities below 100 ppm.

The presently disclosed process converts a relatively high percentage of the III-metal to a polycrystalline III-nitride slab with minimal flow of both the halide-containing vapor and nitrogen-containing vapor. The thickness of the level of III-metal, shape and size of the III-metal containing vessel, flow rates and flow velocities of the reactant vapors and gases and carrier vapors, temperature, and pressure may all be modified to obtain polycrystalline III-nitride of moderate or high density. The particle size of the III-nitride particles making up the polycrystalline mass may also be varied by changing system conditions. The polycrystalline III-nitride slab or mass may be alloyed or doped to achieve desired properties such as use of rare earth and transition metal doping for optical emissions; doping for n-type or p-type conduction; and doping to change the morphology, hardness, grain size, grain orientation, or other structural properties. The polycrystalline III-nitride slabs, blocks, or masses may be processed and used as source material for single crystal III-nitride production, sputtering or laser ablation targets, ceramic solid state lasers, ceramic phosphor materials, or electronic heat sinks Doped and un-doped polycrystalline III-nitride slabs, blocks, and masses may also be processed into fine powder to be used as source material for ceramics made from nitride powders for the applications discussed herein and also for phosphor and other optoelectronic applications.

For example, in the case of $NH_4Cl$ and Ga metal, the ammonium halide is heated to between 175 to 350° C., including 225±25° C., to sublime the ammonium halide into the path of a carrier gas, flowing at, e.g., 225±25 sccm to aid in transporting the ammonium halide over the molten gallium metal. Meanwhile, the Ga in the downstream boat is heated to a molten state between 850-1150° C., including to 1000±50° C., to initially form a porous crust. Once a porous crust is formed, additional ammonia is flowed to increase the reaction rate of the remaining molten gallium metal under the porous crust with the ammonium halide, which will be in the form of ammonia and hydrogen chloride vapor, and the additional ammonia vapor to form a highly densified polycrystalline slab.

The solid ammonium halide may be replaced by a gaseous hydrogen chloride and gaseous ammonia source flowed at or close to equal flow rates for the first or initial reaction, which forms the porous nitride crust. Then, while keeping the flow of the HCl vapor constant, additional ammonia may be flowed to form a dense polycrystalline nitride slab in one or more subsequent reactions.

Thus, the present invention provides a two stage process wherein a halide reacts with a molten group III-metal to form an initial porous crust, which provides access to the molten III-metal beneath. A separate nitrogen source is added to flow into the pores of the crust and react with the molten metal beneath and therein, which converts the crust and the majority of the molten III-metal into a high density, high purity polycrystalline III-nitride slab. The present invention describes a method for making a III-nitride slab of from 75 to 99% dense and preferably from 90 to 99% dense and most preferably from 95 to 99% dense. The resulting slab is substantially solid in cross-section and throughout as depicted in FIG. 7, as opposed to a fragile layer of single crystal GaN platelets sandwiched between two dense crusts as depicted in FIG. 6.

The first flow may vary in length due to size requirements but in general, it is of short duration, e.g., 5-50 minutes, preferably 10-20 minutes and more preferably about 15 minutes. In comparison, the time for conducting the second flow is about 1-8 hours and preferably 3-6 hours. This in-situ, multistep reaction process is critical to obtain complete or nearly complete conversion of a group III-metal to a nearly 100% dense polycrystalline group III-nitride slab. The parameters to achieving full or nearly full conversion of the molten III-metal into a high density group III-nitride slab is an initial brief reaction step at growth pressures and temperatures that form a porous crust, followed by a subsequent, longer reaction step. The second step is performed at similar growth temperatures and pressures with additional reactive nitrogen-containing vapor, such as ammonia, that is flowed over the crust and into contact with the molten III-metal that wells up through the pores.

The porosity of the crust is controlled by the ratio of halide-containing gas flow with that of the nitrogen-containing gas flow during the first flow. Thus, in the case of gallium, it was determined that a ratio of about 1:1 or equivalent halide:ammonia flow over molten gallium metal forms a crust of sufficient porosity as to allow gallium metal below the porous crust to wick up through the pores on subsequent reaction steps until all or nearly all the molten gallium metal is converted into a dense GaN slab.

However, if the vapor flow ratio is significantly above 2:1 (halide:ammonia), GaN powder forms and the reaction can be very slow. If the ratio is significantly below 1:10 (halide:ammonia), the reaction forms a hard, dense, air-tight crust with few or no pores on top of the molten gallium. The air-tight GaN crust then prevents any further reaction of the molten gallium below the crust with the halide and ammonia vapors flowing by.

Once a porous crust is formed per the presently disclosed method, the reaction kinetics of GaN slab formation may be increased and the density of the GaN slab may be increased to greater than 95% by relatively increasing the flow ratio of the nitrogen vapor flow to the halide vapor flow, e.g., by increasing the flow of ammonia vapor relative to the flow of halide during subsequent reaction steps. Thus, the present invention describes a method in which an initial reaction flow ratio of about 1:1 (halide:ammonia) forms the porous crust, followed by a subsequent reaction with a flow ratio of 1:6 (halide:ammonia) over the crust sufficient to form a dense GaN polycrystalline slab in a reactor as described in Examples 3 and 4 herein.

Several preferred temperature and pressure ranges for various III-nitrides such as InGaN, GaN, AlGaN, and AlN polycrystalline were determined using the methods described herein. Use of processing temperatures outside the preferred region below results in products of markedly lower density. Such ranges are: AlN and AlGaN optimally grown at pressures from 0.1-2 atm and temperatures from 1000-1400° C.; GaN optimally grown at atmospheric pressure and temperatures from 910-1150° C.; and InN and InGaN optimally grown at pressures from 1-50 atm at temperatures 910-1100° C., where increased pressure is required to prevent decomposition of InN and InGaN.

In a specific example, obtaining a porous crust is done, per the invention, by flow control of halide and ammonia over the molten gallium in a boat. Ammonia and halide vapor are flowed separately at, e.g. 20 sccms each over the molten gallium, i.e. in a 1:1 flow ratio, for 2-40 minutes, preferably 10-20 minutes, and most preferably about 15 minutes, to create a GaN crust of suitable porosity.

The flow of ammonia is then increased to, e.g. 100 sccms, while holding the flow of halide vapor constant at, e.g. 20 sccms, in a 1:5 (halide:ammonia) flow ratio to flow ample ammonia vapor to the pores in the porous crust to contact the upwelling molten Ga and convert substantially the rest of the molten gallium to GaN, in an operating temperature range of 910°-1150° C.

Once a polycrystalline nitride slab is fully formed, the process may be repeated by, for example, including a group III-metal reservoir in the growth apparatus in which additional group III-metal is distributed on top of the polycrystalline slab and the two step process disclosed herein is repeated a plurality of times to obtain a thick block of dense polycrystalline group III-nitride. Preferably, the multiple cycling of the two-step process to form the block of dense III-nitride would be done without substantially lowering the operating temperatures, and a continuous production method may be performed to form thick group III-nitride blocks from a multi-cycle, two-step process. The halide-containing and nitrogen-containing vapors may be temporally stopped while the group III-metal is distributed on top of the previously formed polycrystalline group III-nitride(s), and the halide-containing and nitrogen-containing vapors may be restarted so that the two-step process may be repeated to convert the additional molten III-metal to dense polycrystalline III-nitride. The cycling process may be repeated multiple times until a thick, group III-polycrystalline block is formed.

For large scale production, large shallow boats or containers of meters in length may be used, or multiple boats may be put in one reaction system. In either case, simultaneous multiple flows in a large number of gas tubes may be employed in the apparatus to allow for uniform or near uniform reaction rates to occur over large areas in an industrial size apparatus. Thus, scalability and lower cost would be achieved. The presently disclosed two-step, in-situ method and one or more repetitions of same would still be required in an industrial reactor apparatus to manufacture highly dense polycrystalline slabs and blocks.

In addition, the two-step method may be expanded to multiple steps to improve and refine the inventive process and to modify the composition of the polycrystalline group III-nitride to obtain the desired composition and/or properties such as grain size, hardness, strength, conductivity, transparency, etc.

The paper entitled, *Synthesis of Dense Polycrystalline GaN of High Purity by the Chemical Vapor Reaction Process*, by Buguo Wang, Michael Callahan and John Bailey, published 11-7-05, in the *Journal of Crystal Growth* 286 (2006) 50-54 is incorporated herein by reference.

Although specific exemplary embodiments have been described in detail in the foregoing description and illustrated in the drawings, various other embodiments, changes, and modifications to the disclosed embodiment(s) will become apparent to those skilled in the art. All such other embodiments, changes, and modifications are intended to come within the spirit and scope of the appended claims.

What is claimed is:

1. A method for making a polycrystalline III-nitride of high purity and density comprising flowing a halide-containing vapor and a nitrogen-containing vapor into contact with a molten group III-metal by:
    (a) flowing the nitrogen-containing vapor having a first nitrogen flow rate and the halide-containing vapor over the molten group III-metal at a first temperature for a first duration sufficient to form a porous crust in a first flow, wherein the porous crust comprises a plurality of pores, the porous crust covering a portion of an upper surface of the molten group III-metal; and
    (b) increasing the first nitrogen flow rate relative to a halide flow rate to obtain a second nitrogen flow rate in a second flow to contact a remaining portion of the molten group III-metal at the porous crust at a second temperature for a second duration sufficient to convert substantially all of the remaining portion of the molten group III-metal to a high density slab comprising the polycrystalline III-nitride, wherein the first temperature and the second temperature are substantially similar, the high density slab having a density of 75 to 99% and being substantially solid throughout.

2. The method of claim 1 wherein the first flow and the second flow are conducted at a temperature range of 910-1150° C.

3. The method of claim 2 wherein the nitrogen-containing vapor and the halide-containing vapor are flowed in a 1:1 flow ratio at 5-40 sccms for at least 5 minutes.

4. The method of claim 2 wherein the first nitrogen flow rate is increased while holding the halide flow rate constant to obtain a 5:1 flow ratio at 50-200 sccms for 2-6 hours to form the high density slab in the second flow.

5. The method of claim 1 wherein the molten group III-metal is placed in at least one container of a sufficiently shallow depth such that substantially all of the molten group III-metal is accessible to the nitrogen-containing vapor and the halide-containing vapor in the first flow and second flow.

6. The method of claim 5 wherein the at least one container is a boat, the boat being sufficiently shallow to shape the molten group III-metal to have a surface area that is larger as compared to a cross-sectional area.

7. The method of claim 6 wherein the high density slab has a thickness of 0.1 to 100 mm.

8. The method of claim 1 wherein the halide-containing vapor is a chloride or HCl, the nitrogen-containing vapor is ammonia, the molten group-III metal is gallium, and the polycrystalline III-nitride is GaN.

9. The method of claim 1 wherein the molten group III-metal is molten gallium and wherein the plurality of pores in the porous crust formed during the first flow are kept open by the second flow to allow the molten gallium below the porous crust to wick up through the plurality of pores, whereby the molten gallium contacts the nitrogen-containing vapor in the second flow to convert at least 90% of the molten gallium to GaN.

10. The method of claim 9 wherein the nitrogen-containing vapor and the halide-containing vapor are flowed in a 1:1 volume ratio over the molten gallium for 5-30 minutes to form the porous crust in the first flow and wherein the first nitrogen flow rate is increased by 2-5 times for 2-6 hours while the halide flow rate is held constant to contact the remaining portion of the molten group III-metal at or near the plurality of pores to form the high density slab in the second flow.

11. The method of claim 1 wherein the nitrogen-containing vapor and the halide-containing vapor are flowed in a 1:1 volume ratio over the molten group-III metal in the first flow and wherein the first nitrogen flow rate is increased 2-5 times while the halide flow rate is held constant to contact the remaining portion of the molten group III-metal at or near the plurality of pores to form the high density slab in the second flow.

12. The method of claim 1 wherein the polycrystalline III-nitride selected from the group consisting of:
    a. AlN and AlGaN grown at pressures from 0.1-2 atm and temperatures from 1000-1400° C.;
    b. GaN grown at 1 atm and temperatures from 910-1150° C.; and
    c. InN and InGaN grown at pressures from 1-50 atm at temperatures of 910-1100° C.

13. The method of claim 1 consisting essentially of two steps comprising the first flow and the second flow, wherein the method is performed in situ.

14. The method of claim 1 wherein the first flow is performed with a molar nitrogen:halide ratio of 2:1 to 1:1 and the second flow is performed with a molar nitrogen/halide ratio of 2-5:1.

15. The method of claim 1 wherein a ratio between the first duration and the second duration is 1/6 to 1/3.

16. The method of claim 1 wherein the molten group III-metal is dispensed into at least one container on top of at least one previously formed high density slab, to form a stack of two or more high density polycrystalline III-nitride blocks.

17. The method of claim 1 further comprising doping the polycrystalline III-nitride with Si, O, Be, Mg, Zn, transition metals, rare earth metals, or combinations thereof.

18. The method of claim 1 wherein a carrier gas assists the flowing of at least one of the halide-containing vapor and the nitrogen-containing vapor into contact with the molten group III-metal.

19. The method of claim 18 wherein the carrier gas comprises nitrogen, argon, helium, hydrogen, or mixtures thereof.

20. The method of claim 1 wherein the halide-containing vapor and the nitrogen-containing vapor are ammonium halide.

21. The method of claim 1 where the halide-containing vapor is hydrogen chloride.

22. The method of claim 1 where the nitrogen-containing vapor is ammonia.

23. The method of claim 1 where the nitrogen-containing vapor is nitrogen plasma.

24. The method of claim 1 where the molten group III-metal is Al, Ga, In, B, or combinations thereof.

* * * * *